United States Patent
Dyer

(10) Patent No.: US 7,906,384 B2
(45) Date of Patent: Mar. 15, 2011

(54) SEMICONDUCTOR DEVICES HAVING TENSILE AND/OR COMPRESSIVE STRESS AND METHODS OF MANUFACTURING

(75) Inventor: Thomas W Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 12/047,379

(22) Filed: Mar. 13, 2008

(65) Prior Publication Data

US 2009/0233455 A1   Sep. 17, 2009

(51) Int. Cl.
*H01L 21/8238* (2006.01)
(52) U.S. Cl. ............ 438/199; 257/E21.328; 438/197; 438/308; 438/795
(58) Field of Classification Search ........... 257/E21.328; 438/197, 199, 308, 795
See application file for complete search history.

(56) References Cited

U.S. PATENT DOCUMENTS

2005/0136583 A1* 6/2005 Chen et al. ............ 438/199
2009/0227084 A1* 9/2009 Wu et al. ............... 438/301

OTHER PUBLICATIONS

Morin et al., "Mechanisms of Stress Generation within a Polysilicon Gate for nMOSFET performance Enhancement", Materials Science and Engineering B 135 (2006) 215-219.*

* cited by examiner

*Primary Examiner* — Asok K Sarkar
(74) *Attorney, Agent, or Firm* — Joseph Petrokaitis; Roberts Mlotkowski Safran & Cole, P.C.

(57) ABSTRACT

A semiconductor device having a tensile and/or compressive strain applied thereto and methods of manufacturing the semiconductor devices to enhance channel strain. The method includes relaxing a gate structure using a low temperature thermal creep process to enhance channel strain. The gate structure undergoes a plastic deformation during the low temperature thermal creep process.

18 Claims, 9 Drawing Sheets

SEMICONDUCTOR DEVICES HAVING TENSILE AND/OR COMPRESSIVE STRESS AND METHODS OF MANUFACTURING

FIELD OF THE INVENTION

The present invention generally relates to semiconductor devices and methods of manufacturing the same, and more specifically, to semiconductor devices having a tensile and/or compressive strain applied thereto and methods of manufacturing the semiconductor devices to enhance channel strain.

BACKGROUND OF THE INVENTION

Mechanical strains within a semiconductor device substrate can modulate device performance by, for example, increasing the mobility of the carriers in the semiconductor device. That is, strains within a semiconductor device are known to enhance semiconductor device characteristics. Thus, to improve the characteristics of a semiconductor device, tensile and/or compressive strains are created in the channel of the n-type devices (e.g., NFETs) and/or p-type devices (e.g., PFETs), respectively. However, the same strain component, for example tensile strain or compressive strain, improves the device characteristics of one type of device (i.e., n-type device or p-type device) while discriminatively affecting the characteristics of the other type device.

Accordingly, in order to maximize the performance of both NFETs and PFETs within integrated circuit (IC) devices, the strain components should be engineered and applied differently for NFETs and PFETs. That is, because the type of strain which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished.

To selectively create tensile strain in an NFET and compressive strain in a PFET, distinctive processes and different combinations of materials are used. For example, it is known to place stressor materials such as, for example, SiGe and/or Si:C in the source and drain regions of the FET to selectively induce appropriate strain in the channels of the FET devices. Another example is the use of liners on gate sidewalls to selectively induce the appropriate strain in the channels of the FET devices. The level of strain that can be applied in the latter situation is typically moderate (i.e., on the order of 100s of MPa). However, strain can be limited by the rigid gate material. More specifically, polysilicon with a high Young's Modules, e.g., upwards of 200 Gpa, effectively restricts the strain component provided by the stressor materials. That is, the rigid polysilicon will oppose relaxation of the stressor materials thereby restricting the channel strain.

Thus, it is desired to provide more cost-effective and simplified methods for creating larger tensile and compressive strains in the channels of the NFETs and PFETs, respectively. Accordingly, there exists a need in the art to overcome the deficiencies and limitations described hereinabove.

SUMMARY OF THE INVENTION

In a first aspect of the invention, a method of forming a semiconductor structure comprises relaxing a gate structure using a low temperature thermal creep process to enhance channel strain.

In an additional aspect of the invention, a method of enhancing device performance comprises building a gate structure having polysilicon, and annealing the gate structure with a low temperature thermal creep process to plastically deform the polysilicon and relax stresses imposed by the polysilicon which act within a channel of the gate structure.

In a further aspect of the invention, a semiconductor structure comprises a relaxed polysilicon gate structured to impose a strain in a channel region under the gate structure.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to a method of improving channel strain in semiconductor devices. By implementing the invention, it is possible to improve channel strain imposed by stressor materials such as, for example, Si:C, SiGe, nitride liners, etc. This, in turn, will improve electron mobility enhancement in the gate channel thereby increasing device performance, regardless of the scale of the device or the type of stressor materials used to impose strain in the channel. More specifically, in implementation, the present invention effectively increases the strain imposed in the CMOS device by relaxing the gate structure. In embodiments, it is also possible to have the gate, by itself, provide a channel strain.

Advantageously, the methods of the invention increase the overall channel strain, regardless of the type and location of the stressor materials. For example, the present invention increases the overall channel strain imposed on the CMOS device from stressor materials such as, for example, Si:C, SiGe, nitride capping material, or other stressor materials. The present invention, likewise, increases the overall channel strain imposed on the CMOS device regardless of whether the stressor material is used as a cap material on the gate structure, a sidewall or spacer material on the gate structure, a liner on the gate structure, and/or within the source and drain regions of the gate structure, to name but a few examples. This improved strain is made possible by relaxing the gate structure and hence reducing opposing stresses which act on the strain. In embodiments, it is also possible to have the gate structure, by itself, provide a channel strain to improve device performance.

Figure 1:
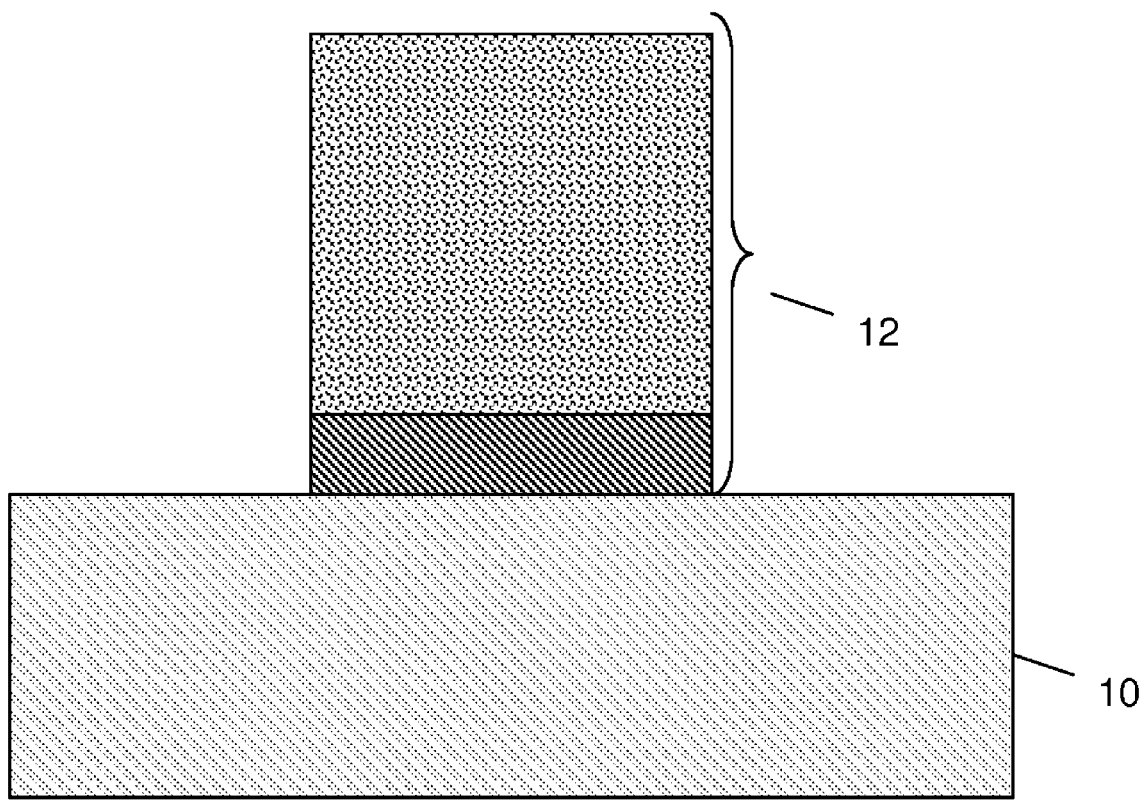
FIG. 1 shows a beginning structure in accordance with the invention.

FIG. 1 shows a conventional starting structure and respective processing steps for forming a FET in accordance with the invention. The starting structure includes, for example, a gate structure 12 deposited on a wafer 10. The gate structure 12 can include, for example, polysilicon deposited and etched over an active area of the wafer 10 in conventional deposition and etching processes. The gate structure 12 and more specifically the polysilicon is a rigid material with a high Young's Modules, e.g., upwards of 200 Gpa, which restricts the strain component provided by stressor materials. For example, the rigid polysilicon will oppose relaxation of stressor materials thereby restricting the channel strain.

Figure 2:
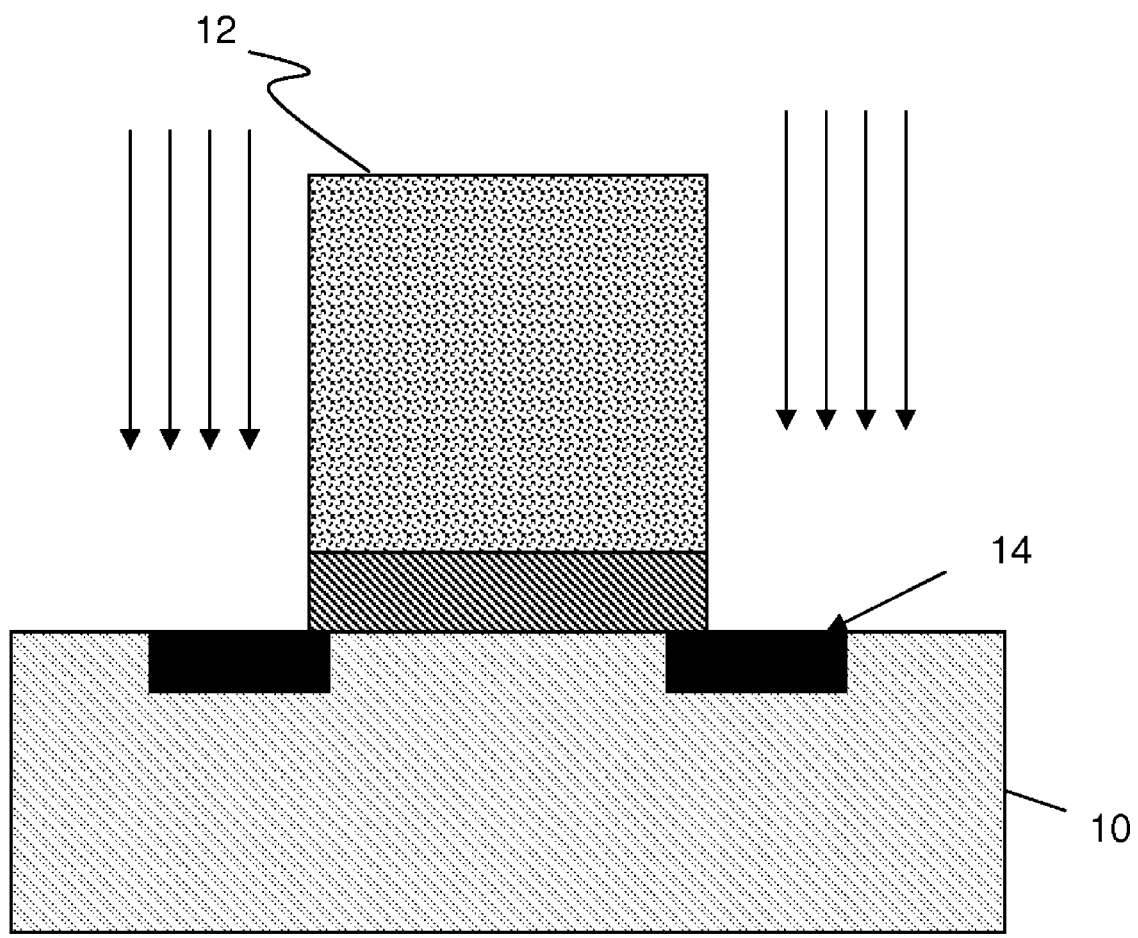
FIGS. 2-4 show intermediate structures and respective processing steps for forming a strained device in accordance with aspects of the invention.

FIG. 2 shows the formation of stressor materials 14, e.g., SiGe or Si:C, in the source and drain regions of FIG. 1. The stressor materials 14 are designed to impose a strain in the channel under the gate structure 12. For example, SiGe can impose a tensile strain under the gate to increase NFET device performance; whereas, Si:C can impose a compressive strain under the gate to increase PFET device performance. At this processing stage, the gate structure 14 opposes the strain imposed by the stressor materials, due to its rigid structure. In one simple example, in a compressive state, the stressor material pushes inwards toward the gate, while the rigid gate pushes outward against the strain.

The stressor materials 14 can be formed in any conventional manner such that an explanation of the formation of such stressor materials on the structure of FIG. 1 is not required for the understanding of this invention. Also, although the stressor materials are shown to be within the source and drain regions of the structure of FIG. 1, it should be understood by those of skill in the art that the present invention also contemplates the use of other stressor materials, types and locations. For example, FIG. 1 can equally represent the deposition of liner materials, cap materials, sidewalls, etc., on the structure, any of which can impose a strain in the channel of the gate structure. As such, those of skill in the art should readily recognize that the present invention is not limited to a specific type or location of stressor material.

Figure 3:
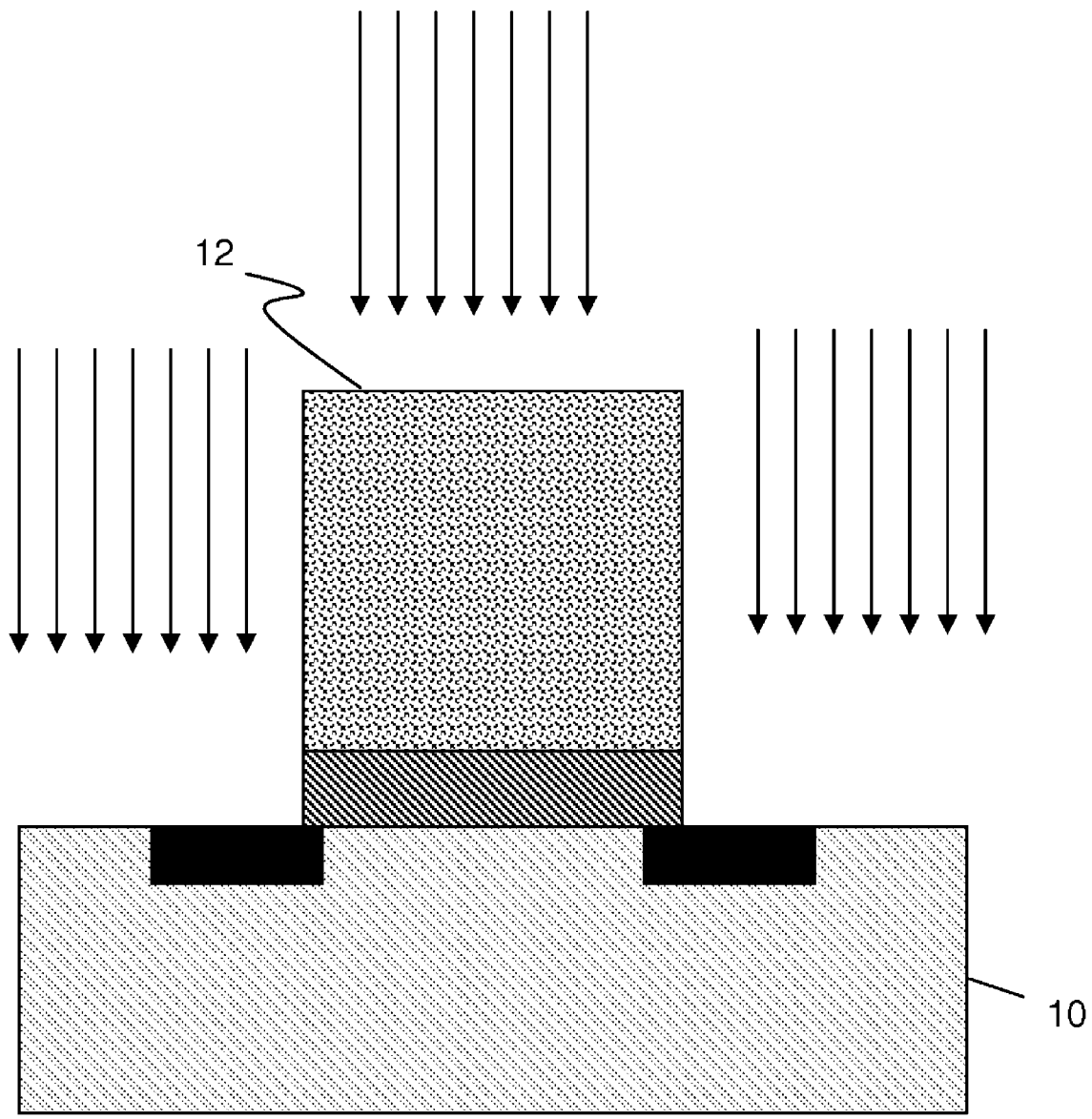

FIG. 3 shows a low temperature thermal creep anneal process in accordance with the invention. In embodiments, the low temperature thermal creep annealing process is performed after a silicide formation, i.e., anneal to form silicide on the structure. During the low temperature thermal creep anneal process, the material of the gate structure undergoes a plastic deformation. Upon cooling, the polysilicon of the gate structure relaxes, removing opposing stresses imposed by the gate structure that result from the applied stressor materials. This, in turn, allows the stressor materials to partially relax thereby increasing the strain in the channel. That is, the strain component provided by the stressor materials is no longer restricted to the same extent by the opposing stresses of the gate material prior to the plastic deformation, thereby effectively increasing the strain imposed by the stressor materials in the channel.

In embodiments, the thermal creep annealing process can be an anneal at about 550° C. to 650° C. for about 2 to 20 minutes. In more preferred embodiments, the thermal creep annealing process takes place at about 550° C. for about 20 minutes. In other embodiments, the thermal creep annealing process can take place at temperatures as low as about 450° C. for a time of about 600 minutes. The thermal creep annealing process should not destroy the materials of the structure and, in particular, not be at a temperature to destroy the silicide. In implementation, the thermal creep annealing process allows the gate material to undergo a plastic deformation, e.g., soften and reshape, which allows the stressor materials to relax thereby increasing the strain under the channel.

Figure 4:
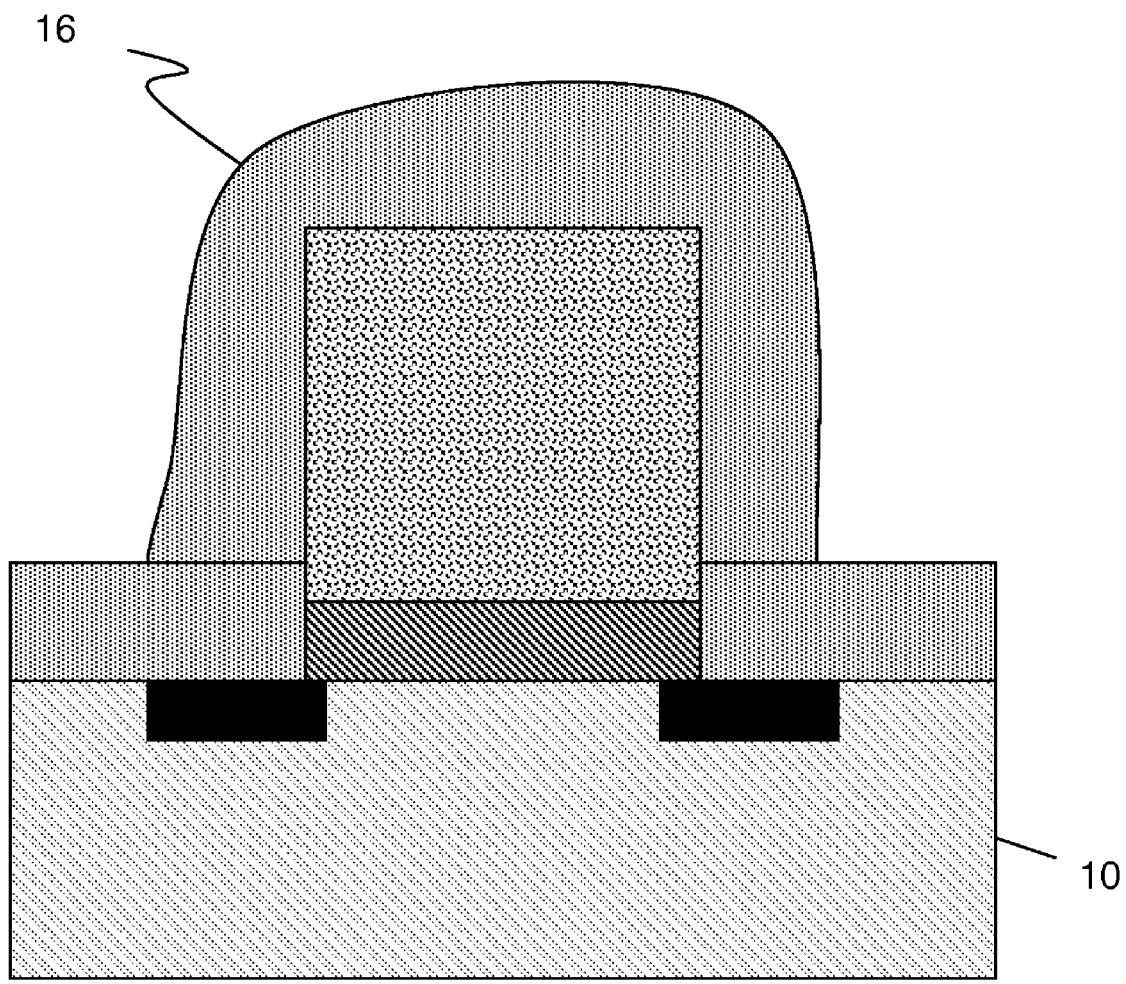
Figure 5:
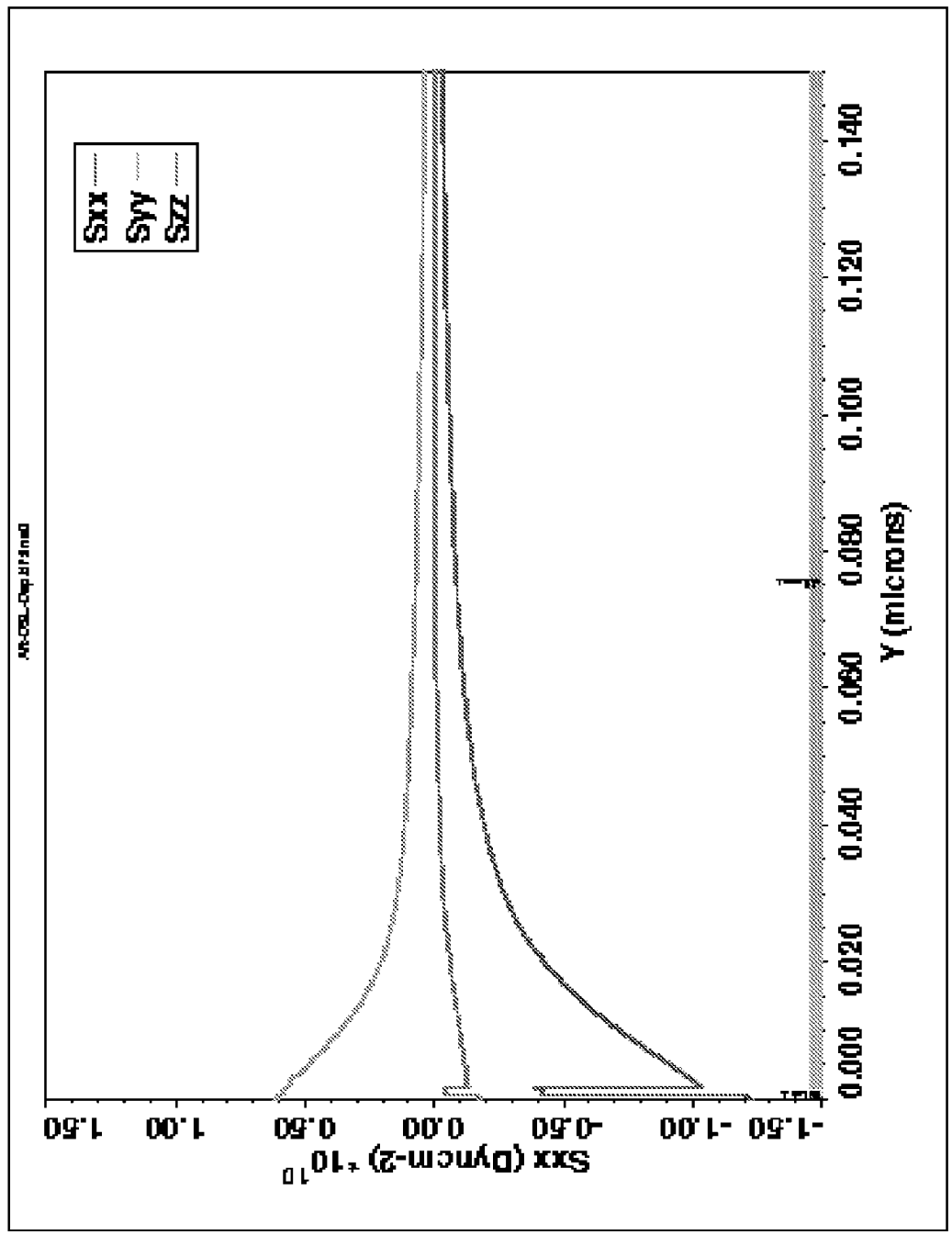
FIG. 5 shows a graph representing a strain in the structure of FIG. 6.

FIG. 4 shows an intermediate structure associated with alterative embodiments of the present invention. More specifically, in FIG. 4 a stress liner 16 is deposited on the structure of FIG. 2 (or other structures with other or no stressor materials, e.g., over the structure of FIG. 1. See, discussion of FIG. 8.) In embodiments, the stress liner 16 is a nitride film which provides an additive strain in the channel by inducing strain in the gate structure 12. This additive strain is shown graphically in FIG. 5.

Figure 6:
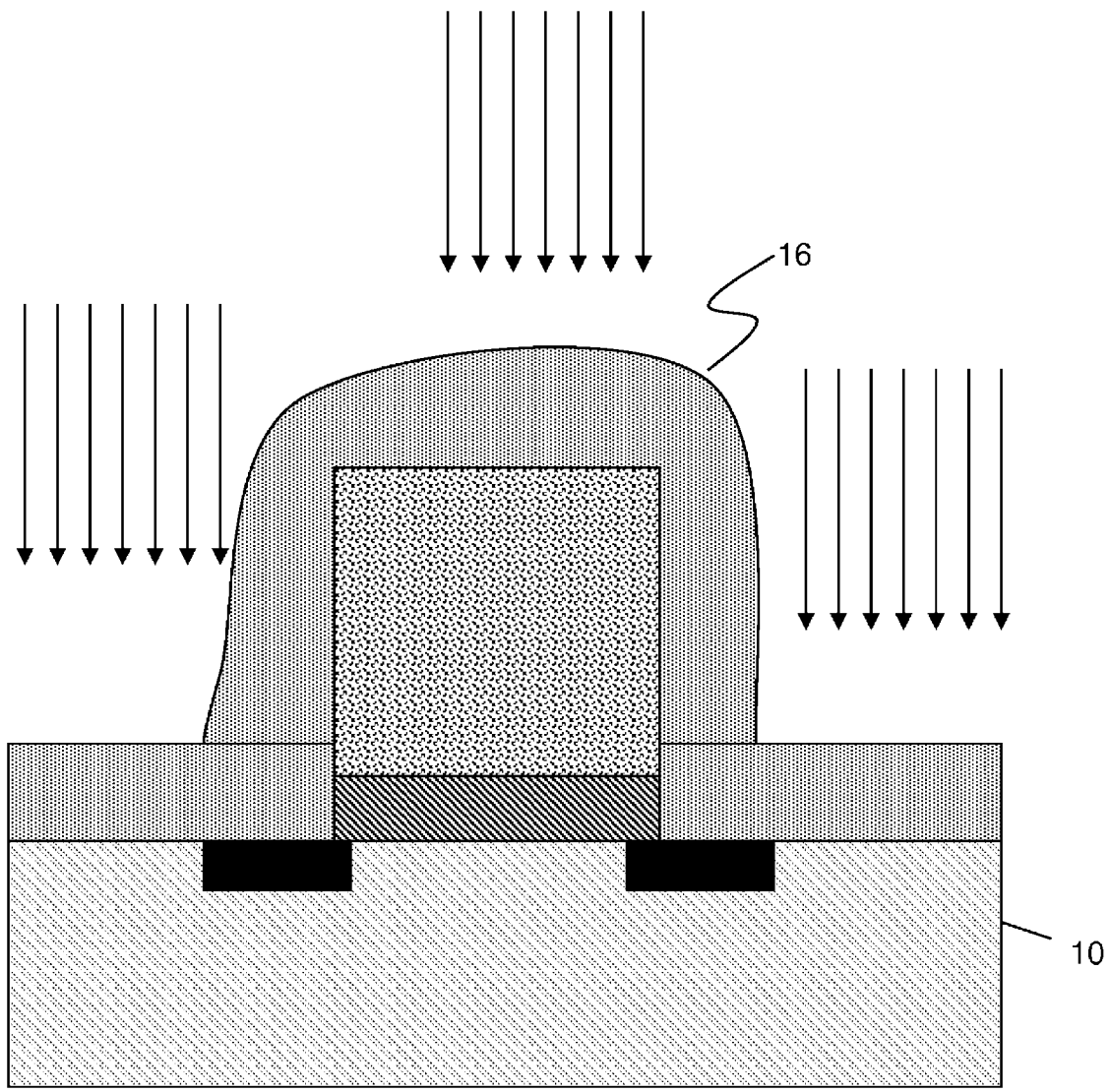
FIGS. 6-8 show alternate structures and respective processing steps for forming a strained device in accordance with different aspects of the invention.

FIG. 6 shows the structure of FIG. 4 undergoing a thermal creep annealing process in accordance with an aspect of the invention. As discussed above, the thermal creep annealing process, in embodiments, relaxes the gate material, removing opposing stresses in the gate structure imposed by the stressor materials. This, in turn, allows the stressor materials to partially relax thereby effectively increasing the strain imposed by the stressor materials in the channel. Also, due to the strain imposed by the stress liner 16, the relaxation of the gate structure can be increased, thereby increasing the strain under the channel.

In embodiments, the thermal creep annealing process can be an anneal at about 550° C. to 650° C. for about 2 to 20 minutes. In more preferred embodiments, the thermal creep annealing process takes place at about 550° C. for about 20 minutes. In other embodiments, the thermal creep annealing process can take place at temperatures as low as about 450° C. for a time of about 600 minutes. The thermal creep annealing process should not destroy the materials of the structure and, in particular, not be at a temperature to destroy the silicide.

Figure 7:
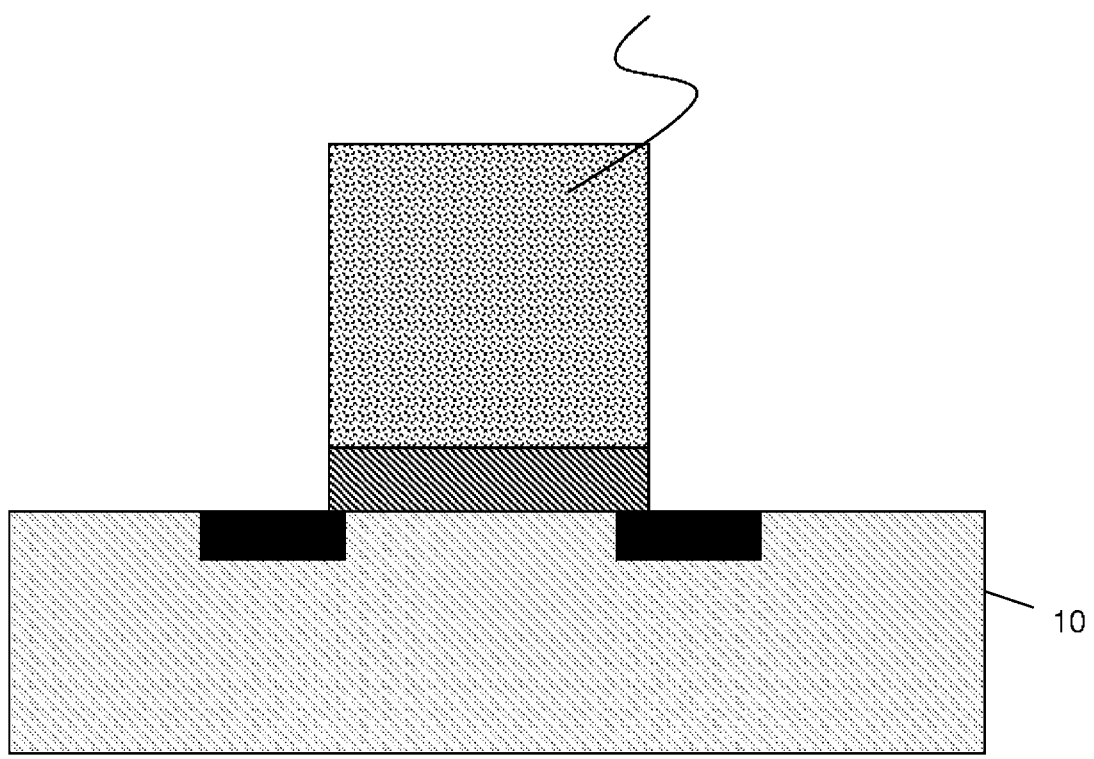

FIG. 7 shows an alternative structure and processing step in accordance with an aspect of the invention. In this embodiment, the nitride liner 16 of FIG. 6 is removed after the annealing process. In this way, the thermal creep annealing process makes the gate structure, itself, a stressor for increasing channel strain. This is done by using the nitride liner 16 as a sacrificial liner to induce strain in the gate structure 12 and the channel. For example, the gate structure 12 is relaxed using the thermal creep annealing process described herein with the stress liner 16 in place. Upon removal of the stress liner, the channel strain partially relaxes. This partial relaxation of the channel strain induces an opposite stress in the gate structure 12. The gate structure 12 thereby locks in part of the channel strain induced by the stress liner.

Figure 8:
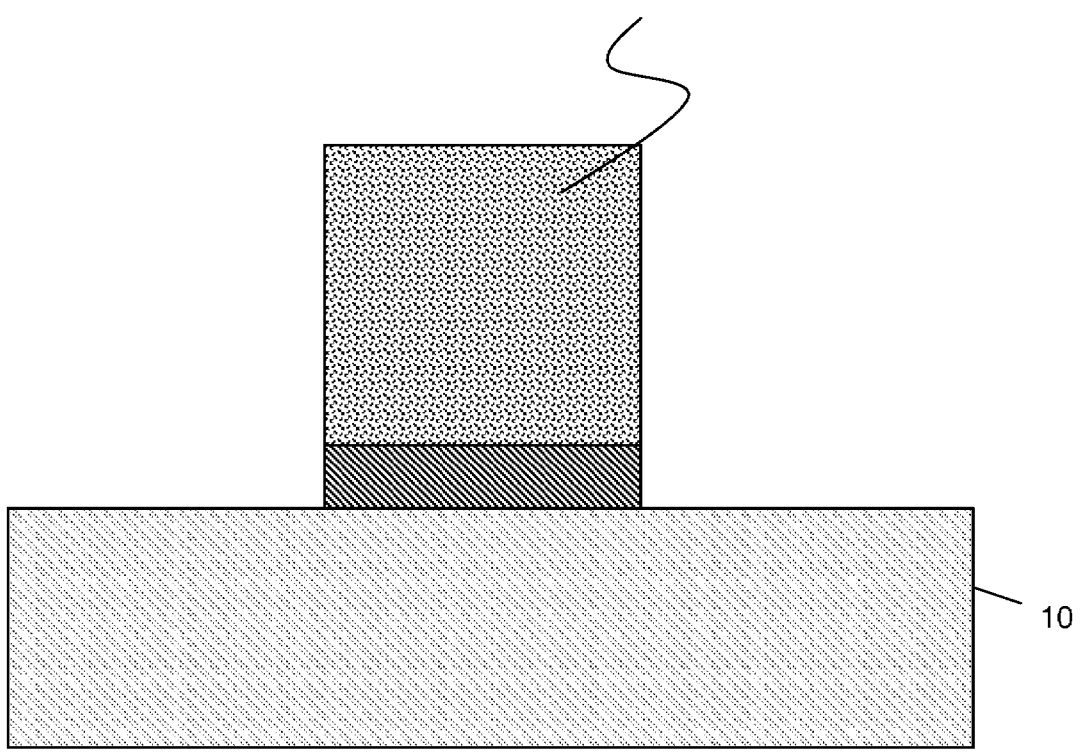

FIG. 8 shows an alternative structure and processing step in accordance with an aspect of the invention. In this embodiment, the nitride liner 16 was placed over the structure of FIG. 1. The structure of FIG. 8 then undergoes a thermal creep annealing process similar to that disclosed with reference to FIG. 6. During the annealing process, the gate structure undergoes a plastic deformation, which effectively places a stress component in the material of the gate and hence imposes a strain in the channel. The nitride layer is then removed, leaving the gate structure as a stressor for increasing channel strain.

More specifically, the nitride liner 16 is used as a sacrificial liner to initially induce strain in the gate structure 12 and the channel. The gate structure 12 is relaxed using the anneal processes with the stress liner 16 in place and, upon removal of the stress liner, the channel strain partially relaxes. This partial relaxation of the channel strain induces an opposite stress in the gate structure 12 thereby locking in part of the channel strain induced by the stress liner.

Figure 9:
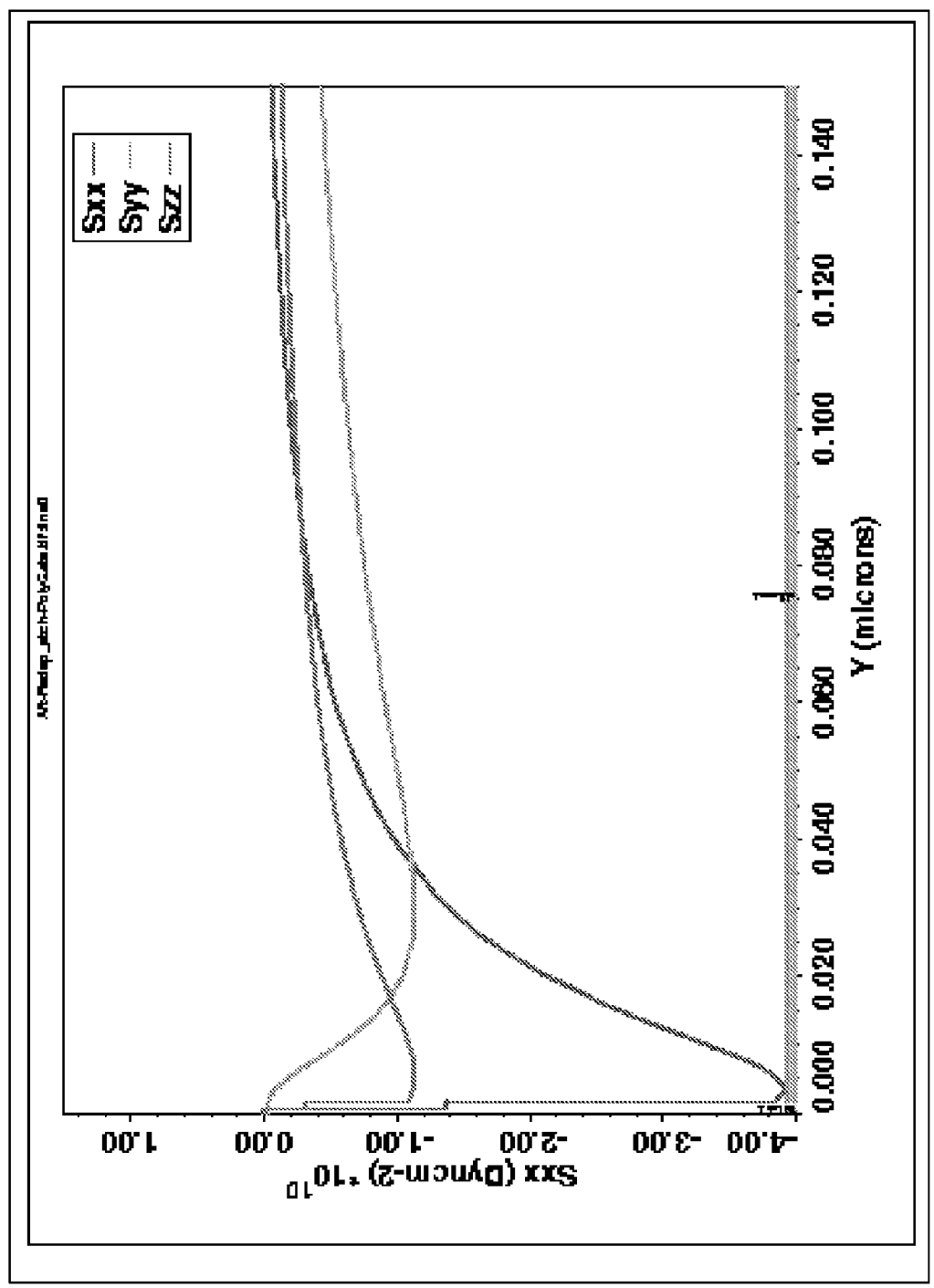
FIG. 9 shows a graph representing a strain in the structure of FIG. 8.

FIG. 9 shows a graph representing a strain in the structure of FIG. 8. As shown in the graph of FIG. 9, even without a stressor material, a strain can be imposed in the channel to increase device performance.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A method of forming a semiconductor structure comprising relaxing a gate structure using a low temperature thermal creep process to enhance channel strain.

2. The method of claim 1, wherein the gate structure undergoes a plastic deformation during the low temperature thermal creep process.

3. The method of claim 1, wherein the low temperature thermal creep process takes place at about 550° C. to 650° C. for about 2 to 20 minutes.

4. The method of claim 1, wherein the low temperature thermal creep process takes place at about 550° C. for about 20 minutes.

5. The method of claim 1, further comprising providing a stress liner over the gate structure prior to the thermal creep.

6. The method of claim 5, further comprising providing stressor materials in the semiconductor structure to provide a strain under a channel of the gate structure.

7. The method of claim 5, further comprising removing the stress liner after the thermal creep.

8. The method of claim 7, further comprising providing stressor materials in the semiconductor structure to provide a strain under a channel of the gate structure.

9. The method of claim 7, wherein the gate structure locks in part of a channel strain induced by the stress liner.

10. The method of claim 5, wherein the stress liner is a nitride layer deposited over the gate structure.

11. The method of claim 1, further comprising providing stressor materials in the semiconductor structure to provide a strain under a channel of the gate structure.

12. The method of claim 1, further comprising providing stressor materials in the semiconductor structure to provide a strain under a channel of the gate structure.

13. A method of enhancing device performance, comprising
building a gate structure having polysilicon; and
annealing the gate structure with a low temperature thermal creep process to plastically deform the polysilicon and relax stresses imposed by the polysilicon and acting within a channel of the gate structure.

14. The method of claim 13, wherein the low temperature thermal creep process takes place at about 550° C. to 650° C. for about 2 to 20 minutes.

15. The method of claim 13, further comprising providing a stress liner over the gate structure prior to the thermal creep.

16. The method of claim 15, further comprising removing the stress liner after the thermal creep.

17. The method of claim 16, wherein the gate structure locks in part of a channel strain induced by the stress liner.

18. The method of claim 13, wherein the low temperature thermal creep process makes the gate structure, by itself, a stressor providing strain in a channel of the gate structure.

* * * * *